(12) United States Patent
Tsai et al.

(10) Patent No.: US 8,772,774 B2
(45) Date of Patent: Jul. 8, 2014

(54) BACKPLANE STRUCTURES FOR ORGANIC LIGHT EMITTING ELECTRONIC DEVICES USING A TFT SUBSTRATE

(75) Inventors: Yaw-Ming A. Tsai, Pak Shek Kok (HK); Ian D. Parker, Santa Barbara, CA (US); Ines Meinel, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 889 days.

(21) Appl. No.: 12/747,963

(22) PCT Filed: Dec. 11, 2008

(86) PCT No.: PCT/US2008/086380
§ 371 (c)(1),
(2), (4) Date: Jun. 14, 2010

(87) PCT Pub. No.: WO2009/079327
PCT Pub. Date: Jun. 25, 2009

(65) Prior Publication Data
US 2010/0258804 A1    Oct. 14, 2010

Related U.S. Application Data

(60) Provisional application No. 61/013,799, filed on Dec. 14, 2007.

(51) Int. Cl.
*H01L 51/52* (2006.01)
(52) U.S. Cl.
USPC ..................................... 257/59; 257/E51.018

(58) Field of Classification Search
USPC ........ 257/40, 59, 72, 291, E27.119, E51.018, 257/E33.001
See application file for complete search history.

(56) References Cited

U.S. PATENT DOCUMENTS

| | | | |
|---|---|---|---|
| 4,356,429 | A | 10/1982 | Tang |
| 4,539,507 | A | 9/1985 | VanSlyke et al. |
| 5,247,190 | A | 9/1993 | Friend et al. |
| 5,278,078 | A | 1/1994 | Kanebako et al. |
| 5,317,169 | A | 5/1994 | Nakano et al. |

(Continued)

FOREIGN PATENT DOCUMENTS

| | | | |
|---|---|---|---|
| EP | 1536465 A1 | 6/2005 | |
| EP | 1601033 A1 | 11/2005 | |

(Continued)

OTHER PUBLICATIONS

CRC Handbook of Chemistry and Physics, 81$^{st}$ Edition(2000-2001) (Book Not Included).

(Continued)

*Primary Examiner* — Selim Ahmed

(57) ABSTRACT

There is provided a backplane for an organic electronic device including a TFT substrate having a base substrate, a polysilicon layer, a gate dielectric layer, a gate electrode, an interlayer dielectric, and a data electrode; an insulating layer over the TFT substrate; a multiplicity of first openings in the insulating layer having a depth d1; a multiplicity of pixelated diode electrode structures, wherein a first set of diode electrode structures are in the first openings; and a bank structure defining pixel areas over the diode electrode structures; wherein the first openings and first set of diode electrode structures are in at least a first set of the pixel areas.

10 Claims, 4 Drawing Sheets

(56) References Cited

U.S. PATENT DOCUMENTS

| | | | |
|---|---|---|---|
| 5,346,850 A | 9/1994 | Kaschmitter et al. |
| 5,408,109 A | 4/1995 | Heeger et al. |
| 5,550,066 A | 8/1996 | Tang et al. |
| 5,739,890 A | 4/1998 | Uda et al. |
| 5,818,550 A | 10/1998 | Kadota et al. |
| 5,828,434 A | 10/1998 | Koden et al. |
| 6,365,916 B1 | 4/2002 | Zhong et al. |
| 6,515,428 B1 | 2/2003 | Yeh et al. |
| 6,518,709 B2 | 2/2003 | Iketsu et al. |
| 6,670,645 B2 | 12/2003 | Grushin et al. |
| 6,727,871 B1 | 4/2004 | Suzuki et al. |
| 6,727,964 B2 | 4/2004 | Tanaka et al. |
| 6,821,811 B2 | 11/2004 | Hirakata et al. |
| 6,850,000 B1 | 2/2005 | Huang et al. |
| 6,862,008 B2 | 3/2005 | Yamazaki |
| 6,862,067 B2 | 3/2005 | Matsumoto |
| 6,863,961 B2 | 3/2005 | Miyashita et al. |
| 7,034,453 B2 | 4/2006 | Kai et al. |
| 7,038,239 B2 | 5/2006 | Murakami et al. |
| 7,098,069 B2 | 8/2006 | Yamazaki et al. |
| 7,317,205 B2 | 1/2008 | Yamazaki et al. |
| 7,339,315 B2 | 3/2008 | Suh et al. |
| 7,482,186 B2 | 1/2009 | Teng et al. |
| 7,492,096 B2 | 2/2009 | Koo et al. |
| 7,501,754 B2 | 3/2009 | Funamoto et al. |
| 7,504,656 B2 | 3/2009 | Lee |
| 7,586,555 B2 | 9/2009 | Lee |
| 7,728,940 B2 | 6/2010 | Konno et al. |
| 7,754,275 B2 | 7/2010 | Mitsuhashi et al. |
| 2002/0033912 A1 | 3/2002 | Tanaka et al. |
| 2002/0047514 A1 | 4/2002 | Sakurai et al. |
| 2002/0145382 A1 | 10/2002 | Lu |
| 2003/0071956 A1 | 4/2003 | Sasaki et al. |
| 2003/0137325 A1 | 7/2003 | Yamazaki et al. |
| 2003/0169242 A1 | 9/2003 | Nakanishi |
| 2003/0189400 A1 | 10/2003 | Nishio et al. |
| 2003/0206144 A1 | 11/2003 | Yudasaka |
| 2004/0023447 A1 | 2/2004 | Hirakata et al. |
| 2004/0061121 A1 | 4/2004 | Uchida |
| 2004/0079941 A1 | 4/2004 | Yamazaki et al. |
| 2004/0102577 A1 | 5/2004 | Hsu et al. |
| 2004/0127637 A1 | 7/2004 | Hsu et al. |
| 2004/0145695 A1 | 7/2004 | Kurahashi et al. |
| 2004/0160176 A1 | 8/2004 | Kim |
| 2005/0008770 A1 | 1/2005 | Kawase |
| 2005/0057151 A1 | 3/2005 | Kuwabara |
| 2005/0061238 A1 | 3/2005 | Sakurada |
| 2005/0179373 A1 | 8/2005 | Kobayashi |
| 2005/0184037 A1 | 8/2005 | Fukuyo et al. |
| 2005/0189535 A1 * | 9/2005 | Hsueh et al. ................ 257/40 |
| 2005/0200618 A1 * | 9/2005 | Kim et al. ................ 345/204 |
| 2005/0205860 A1 | 9/2005 | Hsu et al. |
| 2005/0263757 A1 | 12/2005 | Lee |
| 2005/0264182 A1 | 12/2005 | Seki |
| 2005/0285509 A1 | 12/2005 | Funamoto |
| 2006/0040134 A1 | 2/2006 | Morii et al. |
| 2006/0043360 A1 | 3/2006 | Kim et al. |
| 2006/0057478 A1 | 3/2006 | Kwon et al. |
| 2006/0157690 A1 | 7/2006 | Lee et al. |
| 2006/0226424 A1 | 10/2006 | Chae et al. |
| 2006/0244369 A1 | 11/2006 | Eiichi |
| 2006/0273309 A1 | 12/2006 | Wang et al. |
| 2006/0273314 A1 | 12/2006 | Lee |
| 2006/0290274 A1 | 12/2006 | Oota |
| 2007/0035242 A1 | 2/2007 | Lee et al. |
| 2007/0063195 A1 | 3/2007 | Kim et al. |
| 2007/0075633 A1 | 4/2007 | Yasukawa |
| 2007/0102737 A1 * | 5/2007 | Kashiwabara et al. ........ 257/291 |
| 2007/0103062 A1 | 5/2007 | Jung et al. |
| 2007/0131948 A1 * | 6/2007 | Seo et al. ................ 257/87 |
| 2007/0138943 A1 | 6/2007 | Tano et al. |
| 2007/0164670 A1 | 7/2007 | Park et al. |
| 2007/0205409 A1 | 9/2007 | Lecloux et al. |
| 2007/0238218 A1 | 10/2007 | Teng et al. |
| 2007/0254429 A1 | 11/2007 | Cho et al. |
| 2007/0254432 A1 | 11/2007 | Yamazaki et al. |
| 2007/0267628 A1 | 11/2007 | Koo |
| 2008/0024402 A1 | 1/2008 | Nishikawa et al. |
| 2008/0030833 A1 | 2/2008 | Park |
| 2008/0099764 A1 | 5/2008 | Choi et al. |
| 2008/0128685 A1 | 6/2008 | Honda et al. |
| 2008/0230871 A1 | 9/2008 | Yamazaki et al. |
| 2008/0315761 A1 | 12/2008 | Kobayashi |
| 2009/0008643 A1 | 1/2009 | Yamazaki et al. |
| 2009/0020762 A1 | 1/2009 | Hayakawa et al. |
| 2009/0140646 A1 | 6/2009 | Jeong |
| 2009/0304331 A1 | 12/2009 | Herman et al. |
| 2010/0164372 A1 | 7/2010 | Kai et al. |

FOREIGN PATENT DOCUMENTS

| | | | |
|---|---|---|---|
| EP | 1615473 A1 | 1/2006 |
| JP | 2003255863 A | 9/2003 |
| JP | 2003272871 A | 9/2003 |
| JP | 2005268202 A | 9/2005 |
| JP | 2005340208 A | 12/2005 |
| JP | 2006286309 A | 10/2006 |
| JP | 2006310106 A | 11/2006 |
| JP | 2007005173 A | 1/2007 |
| JP | 2007095613 A | 4/2007 |
| JP | 2007172896 A | 7/2007 |
| WO | 03/008424 A1 | 1/2003 |
| WO | 03/040257 A1 | 5/2003 |
| WO | 03/063555 A1 | 7/2003 |
| WO | 03/091688 A2 | 11/2003 |
| WO | 2004/016710 A1 | 2/2004 |
| WO | WO 2005039248 A1 * | 4/2005 | ............ H05B 33/24 |
| WO | 2005098987 A2 | 10/2005 |
| WO | 2005107327 A1 | 11/2005 |
| WO | 2007106101 A2 | 9/2007 |

OTHER PUBLICATIONS

Kirk-Othmer Encyclopedia of Chemical Technology, Fourth Edition, vol. 18, p. 837-860, by Y. Wang.

IPRP, International Bureau of WIPO, Geneva CH, PCT/US2008/086380, PCT counterpart of the present application, Nora Lindner, Authorized Officer, Jun. 15, 2010.

Extended European Search Report for Application No. 08862732.8, counterpart to U.S. Appl. No. 12/747,963; Dec. 19, 2012.

PCT International Search Report for Application No. PCT/US2008/079791, counterpart to U.S. Appl. No. 12/250,759; Ann De Laere, Authorized Officer; EPO; Mar. 2, 2009.

PCT International Search Report for Application No. PCT/US2008/079795, counterpart to U.S. Appl. No. 12/250,775; Marylene Faou, Authorized Officer; EPO; Jan. 26, 2009.

PCT International Search Report for Application No. PCT/US2008/079799, counterpart to U.S. Appl. No. 12/250,788; Steve Welter, Authorized Officer; EPO; Mar. 12, 2009.

PCT International Search Report for Application No. PCT/US2008/086380, counterpart to U.S. Appl. No. 11/747,963; Lee W. Young, Authorized Officer; ISA/US; Feb. 12, 2009.

* cited by examiner

BACKPLANE STRUCTURES FOR ORGANIC LIGHT EMITTING ELECTRONIC DEVICES USING A TFT SUBSTRATE

RELATED APPLICATION

This application claims priority under 35 U.S.C. §119(e) from Provisional Application No. 61/013,799 filed Dec. 14, 2007 which is incorporated by reference in its entirety.

BACKGROUND INFORMATION

1. Field of the Disclosure

This disclosure relates in general to electronic devices and processes for forming the same. More specifically, it relates to backplane structures and devices formed using the backplane structures.

2. Description of the Related Art

Electronic devices, including organic electronic devices, continue to be more extensively used in everyday life. Examples of organic electronic devices include organic light-emitting diodes ("OLEDs"). The devices are formed on backplanes having active matrix circuitry with thin film transistors ("TFTs"). There will be several organic layers with the OLED as well as several inorganic layers in the backplane. Due to the multiple layers, OLEDs exhibit what is know as a "weak cavity" effect. This is an optical interference phenomenon which influences the emission colors of the emitting materials.

To best match the emission colors, typically red, green, and blue, to match the display specifications, a different optimized cavity could be formed for each color. However, due to production cost and throughput considerations, this is not practical.

In addition, when emission is through the bottom of the backpanel, the dielectric layers in the TFT can also create optical interference and change the emission color.

Thus, there is a need for device structures that will allow for the flexibility to correct for the above problems to produce the desired emission colors.

SUMMARY

There is a provided a backplane for an organic electronic device having a multiplicity of pixel areas, the backplane comprising:

a TFT substrate comprising a base substrate, a polysilicon layer, a gate dielectric layer, a gate electrode, an interlayer dielectric, and a data electrode;

an insulating layer over the TFT substrate;

a multiplicity of first openings in the insulating layer having a depth d1;

a multiplicity of pixelated diode electrode structures, wherein a first set of diode electrode structures are in the first openings;

a bank structure defining pixel areas over the diode electrode structures;

wherein the first openings and first set of diode electrode structures are in at least a first set of the pixel areas.

There is also provided a backplane as described above, having a multiplicity of second openings in the insulating layer having a depth d2, wherein a second set of diode electrode structures are in the second openings, and the second openings are in a second set of pixel areas.

There is also provided a backplane as described above, having a multiplicity of third openings in the insulating layer having a depth d3, wherein a third set of diode electrode structures are in the third openings, and the third openings are in a third set of pixel areas.

There is also provided an organic electronic device comprising organic active layers formed in the pixel openings of any of the above backplanes.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1A:
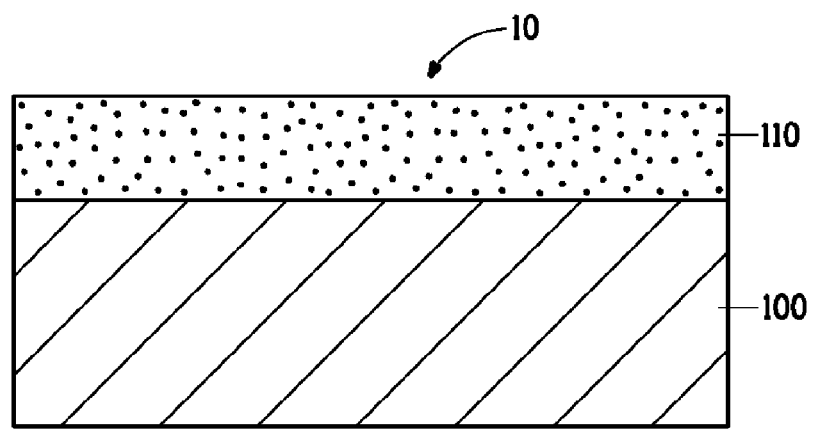
FIG. 1A includes as illustration, a schematic diagram of a cross-sectional view of a partially completed conventional backplane.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Backplane, and the Process for Forming the Openings, and the Electronic Device.

1. DEFINITIONS AND CLARIFICATION OF TERMS

Before addressing details of embodiments described below, some terms are defined or clarified.

As used herein, the term "active" when referring to a layer or material is refers to a layer or material which electronically facilitates the operation of the device. Examples of active materials include, but are not limited to, materials which conduct, inject, transport, or block a charge, where the charge can be either an electron or a hole. Examples also include a layer or material that has electronic or electro-radiative properties. An active layer material may emit radiation or exhibit a change in concentration of electron-hole pairs when receiving radiation.

The term "active matrix" is intended to mean an array of electronic components and corresponding driver circuits within the array.

The term "backplane" is intended to mean a workpiece on which organic layers can be deposited to form an electronic device.

The term "circuit" is intended to mean a collection of electronic components that collectively, when properly connected and supplied with the proper potential(s), performs a function. A circuit may include an active matrix pixel within an array of a display, a column or row decoder, a column or row array strobe, a sense amplifier, a signal or data driver, or the like.

The term "depth" as it refers to the openings in the insulating layer described herein, is intended to mean the distance from the top surface of the layer in which the opening is formed to the bottom of the opening. Depth is measured in the direction perpendicular to the base support. "Top surface" refers to the surface furthest removed from the base support.

The term "diode electrode" is intended to mean one of an anode and a cathode used to form a rectifying junction. The term "rectifying junction" is intended to mean a junction within a semiconductor layer or a junction formed by an interface between a semiconductor layer and a dissimilar material, in which charge carriers of one type flow easier in one direction through the junction compared to the opposite direction. A pn junction is an example of a rectifying junction that can be used as a diode.

The term "driver circuit" is intended to mean a circuit configured to control the activation of an electronic component, such as an organic electronic component.

The term "electrically continuous" is intended to mean a layer, member, or structure that forms an electrical conduction path without an electrical open circuit.

The term "electrode" is intended to mean a structure configured to transport carriers. For example, an electrode may be an anode, a cathode. Electrodes may include parts of transistors, capacitors, resistors, inductors, diodes, organic electronic components and power supplies.

The term "electronic component" is intended to mean a lowest level unit of a circuit that performs an electrical function. An electronic component may include a transistor, a diode, a resistor, a capacitor, an inductor, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the proper potential(s), performs a function. An electronic device may include, or be part of, a system. Examples of electronic devices include displays, sensor arrays, computer systems, avionics, automobiles, cellular phones, and many other consumer and industrial electronic products.

The term "insulative" or "insulating" is used interchangeably with "electrically insulating". These terms and their variants are intended to refer to a material, layer, member, or structure having an electrical property such that it substantially prevents any significant current from flowing through such material, layer, member or structure.

The term "layer" is used interchangeably with the term "film" and refers to a coating covering a desired area. The area can be as large as an entire device or as small as a specific functional area such as the actual visual display, or as small as a single sub-pixel. Films can be formed by any conventional deposition technique, including vapor deposition, liquid deposition and thermal transfer. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing.

The term "light-transmissive" is used interchangeably with "transparent" and is intended to mean that at least 50% of incident light of a given wavelength is transmitted. In some embodiments, 70% of the light is transmitted.

The term "liquid composition" is intended to mean a liquid medium in which a material is dissolved to form a solution, a liquid medium in which a material is dispersed to form a dispersion, or a liquid medium in which a material is suspended to form a suspension or an emulsion. The term "liquid medium" is intended to mean a liquid material, including a pure liquid, a combination of liquids, a solution, a dispersion, a suspension, and an emulsion. Liquid medium is used regardless whether one or more solvents are present.

The term "opening" is intended to mean an area characterized by the absence of a particular structure that surrounds the area, as viewed from the perspective of a plan view.

The term "organic electronic device" is intended to mean a device including one or more semiconductor layers or materials. Organic electronic devices include: (1) devices that convert electrical energy into radiation (e.g., an light-emitting diode, light emitting diode display, or diode laser), (2) devices that detect signals through electronics processes (e.g., photodetectors (e.g., photoconductive cells, photoresistors, photoswitches, phototransistors, or phototubes), IR detectors, or biosensors), (3) devices that convert radiation into electrical energy (e.g., a photovoltaic device or solar cell), and (4) devices that include one or more electronic components that include one or more organic semiconductor layers (e.g., a transistor or diode).

The term "overlying," when used to refer to layers, members or structures within a device, does not necessarily mean that one layer, member or structure is immediately next to or in contact with another layer, member, or structure.

The term "perimeter" is intended to mean a boundary of a layer, member, or structure that, from a plan view, forms a closed planar shape.

The term "photoresist" is intended to mean a photosensitive material that can be formed into a layer. When exposed to activating radiation, at least one physical property and/or chemical property of the photoresist is changed such that the exposed and unexposed areas can be physically differentiated.

The term "pixel" is intended to mean a portion of an array corresponding to one electronic component and its corresponding electronic component(s), if any, that are dedicated to that specific one electronic component. In one embodiment, a pixel has an OLED and its corresponding pixel driving circuit. Note that a pixel as used in this specification can be a pixel or subpixel as those terms are used by skilled artisans outside of this specification.

The term "TFT electrode" is intended to mean an electrode within the TFT substrate, such as the gate electrode, and source and drain electrodes.

The term "structure" is intended to mean one or more patterned layers or members, which by itself or in combination with other patterned layer(s) or member(s), forms a unit that serves an intended purpose. Examples of structures include electrodes, well structures, cathode separators, and the like.

The term "support" or "base support" is intended to mean a base material that can be either rigid or flexible and may be include one or more layers of one or more materials, which can include, but are not limited to, glass, polymer, metal or ceramic materials or combinations thereof.

The term "TFT substrate" is intended to mean an array of TFTs and/or driving circuitry to make panel function on a base support.

The term "thickness" is intended to refer to the dimension perpendicular to the base support.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. THE BACKPLANE

There is provided herein a new backplane for an electronic device. The backplane comprises:

a TFT substrate comprising a base substrate, a polysilicon layer, a gate dielectric layer, a gate electrode, an interlayer dielectric, and a data electrode;

an insulating layer over the TFT substrate;

a multiplicity of first openings in the insulating layer having a depth d1;

a multiplicity of pixelated diode electrode structures, wherein a first set of diode electrode structures are in the first openings;

a bank structure defining pixel areas over the diode electrode structures;

wherein the first openings and first set of diode electrode structures are in at least a first set of the pixel areas.

TFT substrates are well known in the electronic art. The base support may be a conventional support as used in organic electronic device arts. The base support can be flexible or rigid, organic or inorganic. In some embodiments, the base support is transparent. In some embodiments, the base support is glass or a flexible organic film. The TFT array may be located over or within the support, as is known. The support can have a thickness in the range of about 12 to 2500 microns.

The term "thin-film transistor" or "TFT" is intended to mean a field-effect transistor in which at least a channel region of the field-effect transistor is not principally a portion of a base material of a substrate. In one embodiment, the channel region of a TFT includes a-Si, polycrystalline silicon, or a combination thereof. The term "field-effect transistor" is intended to mean a transistor, whose current carrying characteristics are affected by a voltage on a gate electrode. A field-effect transistor includes a junction field-effect transistor (JFET) or a metal-insulator-semiconductor field-effect transistor (MISFET), including a metal-oxide-semiconductor field-effect transistor (MOSFETs), a metal-nitride-oxide-semiconductor (MNOS) field-effect transistor, or the like. A field-effect transistor can be n-channel (n-type carriers flowing within the channel region) or p-channel (p-type carriers flowing within the channel region). A field-effect transistor may be an enhancement-mode transistor (channel region having a different conductivity type compared to the transistor's S/D regions) or depletion-mode transistor (the transistor's channel and S/D regions have the same conductivity type).

TFT structures and designs are well known. The TFT structure usually includes gate, source, and drain electrodes, and a sequence of inorganic layers, usually referred to as a buffer layer, gate insulator, and interlayer. Each of these layers may be made up of one or more individual layers. In some embodiments, the TFT structures comprising a base substrate, a polysilicon layer, a gate dielectric layer, a gate electrode, an interlayer dielectric, and a data electrode.

An insulating layer is present over the TFT substrate. In some embodiments, the insulating layer is an organic planarization layer. Any organic dielectric material can be used for the planarization layer. In general, the organic material should have a dielectric constant of at least 2.5. In some embodiments, the organic material is selected from the group consisting of epoxy resins, acrylic resins, or polyimide resins. Such resins are well known, and many are commercially available. In some embodiments, the organic planarization layer has a thickness of 0.5 to 5 microns; in some embodiments, 1 to 3 microns.

In some embodiments, the insulating layer is an inorganic passivation layer. Any inorganic dielectric material can be used. In some embodiments, the inorganic material is a metal oxide or nitride. In some embodiments, the inorganic material is selected from the group consisting of silicon oxides, silicon nitrides, or combinations thereof. In some embodiments, the inorganic passivation layer has a thickness of 100 to 500 nm; in some embodiments, 300-400 nm.

In the backplanes described herein, there is at least one set of first openings in the insulating layer corresponding to at least one set of pixel areas. There may be other pattern elements present, such as vias for electrical connections. In some embodiments, the layer is also patterned to remove it from the areas where the electronic device will be sealed.

The first openings have a depth d1. The depth can be some fraction of the thickness of the insulating layer, the full thickness of the insulating layer, or may extend beyond the insulating layer into one or more of the interlayer and gate insulator layers of the TFT substrate. In some embodiments, the first openings are in a first set of pixel areas for a first color. The depth is selected to optimize the cavity for the particular emitting material which is to be deposited for that color in order to achieve the desired color of emission.

The size of the first openings in the plane of the insulating layer (the plane perpendicular to the direction of the depth) is at least as large as the diode electrode structures to be deposited in the opening. In some embodiments, the material used to form the diode electrode structures, forms along the walls as well as the bottom of the first opening. Thus, the effective electrode area is less than the total area of the opening. In some embodiments, the first opening is larger than the desired electrode area. In some embodiments, the first opening is 1.1-1.5 times the desired electrode area.

In some embodiments, the insulating layer also has a multiplicity of second openings in a second set of pixel areas. The second openings have a depth d2. As with d1, d2 can be some fraction of the thickness of the insulating layer, the full thickness of the insulating layer, or may extend beyond the insulating layer into one or more of the interlayer and gate insulator layers of the TFT substrate. In some embodiments, the second via openings are in a second set of pixel areas for a second color. The depth d2 is selected to optimize the cavity for the particular emitting material which is to be deposited for that color in order to achieve the desired color of emission. In some embodiments, d2 is different from d1.

In some embodiments, the insulating layer also has a multiplicity of third openings in a third set of pixel areas. The third openings have a depth d3. As with d1, d3 can be some fraction of the thickness of the insulating layer, the full thickness of the insulating layer, or may extend beyond the insulating layer into one or more of the interlayer and gate insulator layers of the TFT substrate. In some embodiments, the third openings are in a third set of pixel areas for a third color. The depth d3 is selected to optimize the cavity for the particular emitting material which is to be deposited for that color in order to achieve the desired color of emission. In some embodiments, d3 is different from d2 and d1.

In some embodiments, d1, d2 and d3 are all the same; in some embodiments, d1, d2 and d3 can be all different; in some embodiments, two are the same and are different from the third one.

A multiplicity of diode electrode structures are present on the insulating layer. The electrodes may be anodes or cathodes. The electrodes are pixelated. The diode electrodes are present in at least the pixel areas. They may be formed in a patterned array of structures having plan view shapes, such as squares, rectangles, circles, triangles, ovals, and the like. Generally, the electrodes may be formed using conventional processes (e.g. deposition, patterning, or a combination thereof).

In some embodiments, the electrodes are transparent. In some embodiments, the electrodes comprise a transparent conductive material such as indium-tin-oxide (ITO). Other transparent conductive materials include, for example, indium-zinc-oxide (IZO), zinc oxide, tin oxide, zinc-tin-oxide (ZTO), aluminum-tin-oxide (ATO), aluminum-zinc-oxide (AZO), elemental metals, metal alloys, and combinations thereof. In some embodiments, the electrodes are anodes for the electronic device. The electrodes can be formed using conventional techniques, such as selective deposition using a stencil mask, or blanket deposition and a conventional lithographic technique to remove portions to form the pattern. The thickness of the electrode is generally in the range of approximately 50 to 150 nm.

The bank structure is present in a pattern over the electrodes wherein there is an opening in the pixel areas where organic active material(s) will be deposited. Surrounding each pixel opening is a bank. The bank structure can be inorganic or organic. Materials such as those discussed above for the insulating layer may be used for the bank structure, using the techniques discussed above.

The organic bank structure generally has a thickness of about 0.5 to 3 microns. In some embodiments, the thickness is about 2 to 3 microns. The inorganic bank structure generally has a thickness of about 1000 to 4000 Å. In some embodiments, the thickness is about 2000 to 3000 Å.

Figure 1B:
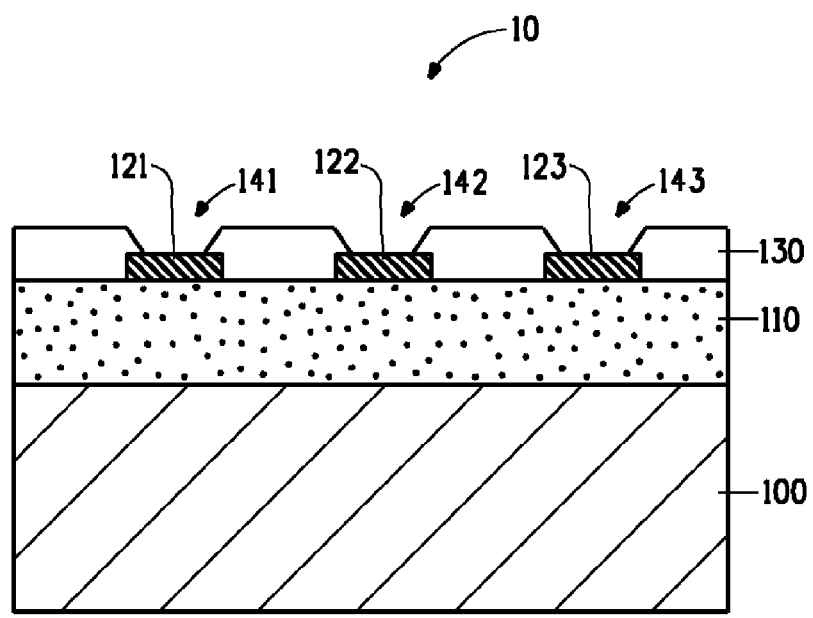
FIG. 1B includes as illustration, a schematic diagram of the completed conventional backplane from FIG. 1A.

A conventional backplane 10 is shown schematically in FIGS. 1A and 1B. A partially completed backplane is shown in FIG. 1A. The TFT substrate 100 includes various structures (not shown) known for TFT function, including, but not limited to, gate electrodes, source/drain electrodes, an interlayer, a gate insulator, a buffer layer, a polysilicon layer, and a base substrate. There is an insulating layer 110 over the TFT substrate 100.

The completed backplane is shown in FIG. 1B. Pixellated diode electrodes 121, 122, and 123 have been formed on insulating layer 110. A bank structure 130 is formed over the electrode layer. The bank defines pixel openings 141, 142, and 143, where active organic materials will be deposited to form the device. The three pixel openings shown represent openings for red, green and blue pixels. As can be seen in the drawing, the underlying structure for the three pixel openings is the same.

Figure 2A:
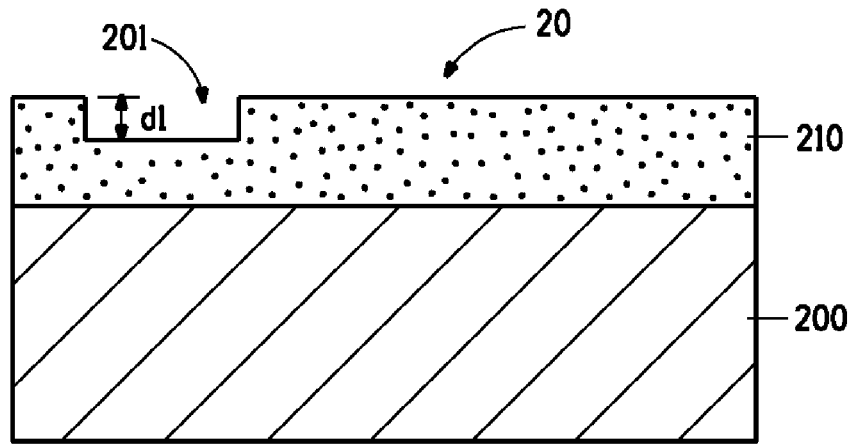
FIG. 2A includes as illustration, a schematic diagram of a cross-sectional view of a partially completed backplane as described herein.
Figure 2B:
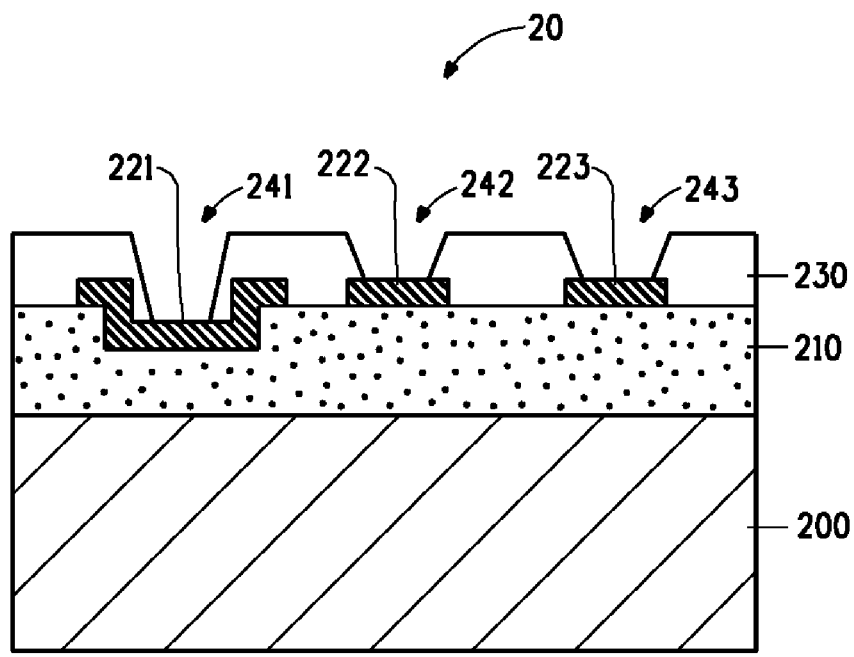
FIG. 2B includes as illustration, a schematic diagram of a cross-sectional view of the completed new backplane from FIG. 2A.

A new backplane 20 is shown schematically in FIGS. 2A and 2B. A partially completed backplane is shown in FIG. 2A. The TFT substrate 200 is as described for FIG. 1A above. There is an insulating layer 210. A first opening area 201 has been formed in the insulating layer 210. Although only one opening 201 is shown, this represents a multiplicity of openings in an actual backplane. The first openings 201 have a depth shown as d1. In this figure, the first opening 201 is shown to be only in the insulating layer 210. It is also possible for the first opening 201 to continue into one or more of the interlayer and gate insulator layers of TFT substrate 200.

A completed backplane is shown in FIG. 2B. A pixelated diode electrode is shown as 221, 222, and 223. A bank structure 230 is formed over the diode electrode. The bank defines pixel openings 241, 242, and 243, where active organic materials will be deposited to form the device. Pixel openings 242 and 243 are over the full thickness of the insulating layer 210. Pixel opening 241 is over the first opening (201 from FIG. 2A) in the insulating layer 210. As can be seen in the drawing, the underlying structure for the pixel opening 241 is quite different from pixel openings 242 and 243.

Figure 3A:
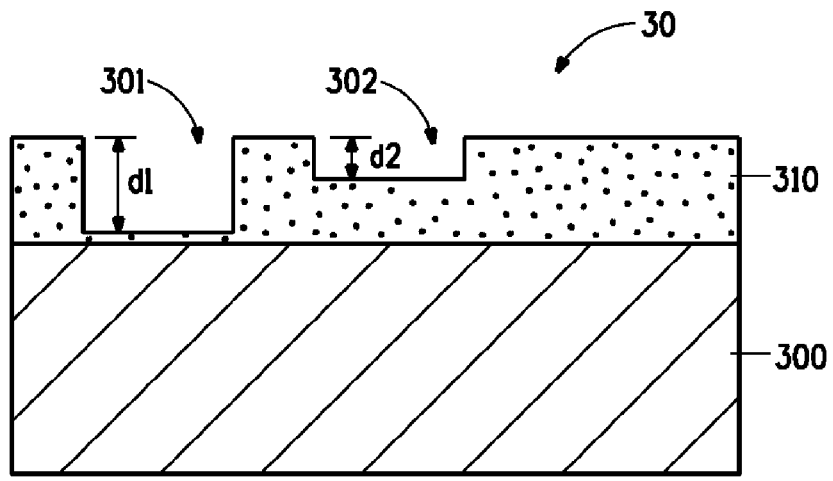
FIG. 3A includes as illustration, a schematic diagram of a cross-sectional view of a partially completed backplane as described herein.
Figure 3B:
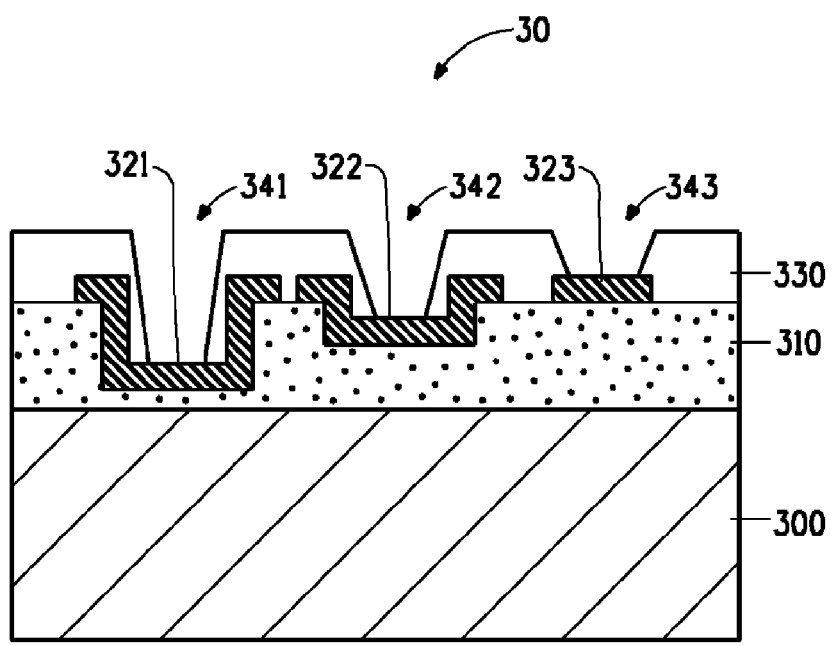
FIG. 3B includes as illustration, a schematic diagram of a cross-sectional view of the completed new backplane from FIG. 3A.

A new backplane 30 is shown schematically in FIGS. 3A and 3B. A partially completed backplane is shown in FIG. 3A. The TFT substrate 300 is as described for FIG. 1A. There is an insulating layer 310. A first opening 301 and a second opening 302 have been formed in the insulating layer 310. The first openings 301 have a depth shown as d1. The second openings 302 have a depth shown as d2. As is illustrated in the drawing, the depth d1 of the first opening is greater than the depth d2 of the second opening. In this figure, the first opening 301 and the second opening 302 are shown to be only in the insulating layer 310. It is also possible for either or both of the first opening 310 and the second opening 302 to continue into one or more of the interlayer and gate insulator layers of TFT substrate 300.

A completed backplane is shown in FIG. 3B. A pixelated diode electrode is shown as 321, 322, and 333. A bank structure 330 is formed over the diode electrode. The bank defines pixel openings 341, 342 and 343, where active organic materials will be deposited to form the device. Pixel opening 343 is over the full thickness of the insulating layer 310. Pixel opening 341 is over the first opening in the insulating layer 310. Pixel opening 342 is over the second opening in the insulating layer 310. Pixel opening 343 is over the full thickness of the insulating layer 310. As can be seen in the drawing, the underlying structures for three pixel openings are quite different.

In some embodiments, a third set of openings with a depth d3 is formed in the insulating layer. In these embodiments, none of the pixel openings is over the full thickness of the insulating layer. The depths of the openings can be the same or different.

Figure 4A:
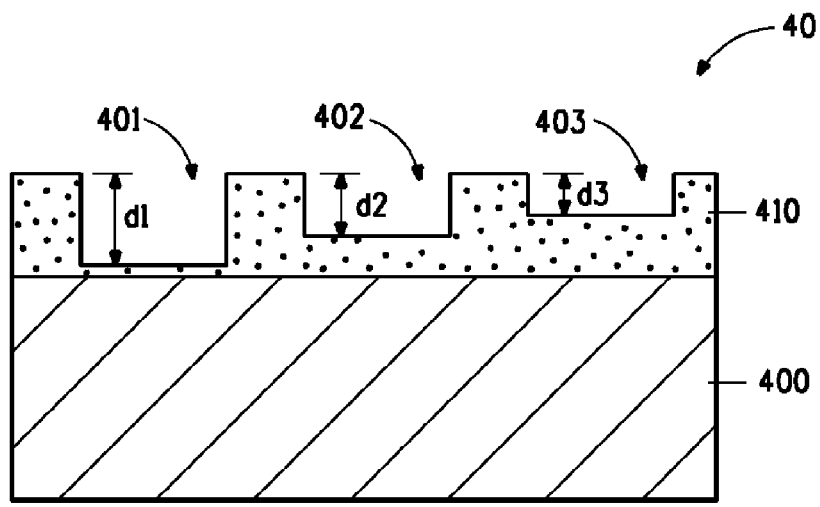
FIG. 4A includes as illustration, a schematic diagram of a cross-sectional view of a partially completed backplane as described herein.
Figure 4B:
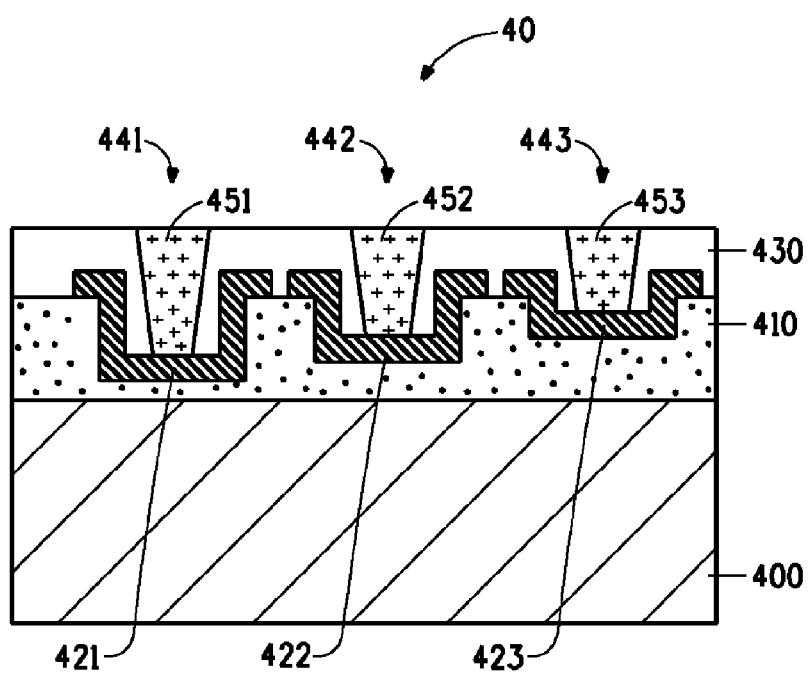
FIG. 4B includes as illustration, a schematic diagram of a cross-sectional view of the completed new backplane from FIG. 4A.

A new backplane 40 is shown schematically in FIGS. 4A and 4B. A partially completed backplane is shown in FIG. 4A. The TFT substrate 400 is as described for FIG. 1A. There is an insulating layer 410. A first opening 401, a second opening 402, and a third opening 403 have been formed in the insulating layer 410. The first openings 301 have a depth shown as d1. The second openings 302 have a depth shown as d2. The third openings 403 have a depth shown as d3. As is illustrated in the drawing, the depth d1 of the first opening is greater than the depth d2 of the second opening, and the depth d2 of the second opening is greater than the depth d3 of the third opening. In this figure, the first opening 401, the second opening 402, and the third opening 403 are shown to be only in the insulating layer 410. It is also possible for one, both or all three of the first opening 410, the second opening 402, and the third openings 403 to continue into one or more of the interlayer and gate insulator layers of TFT substrate 400.

A completed backplane is shown in FIG. 4B. A pixelated diode electrode is shown as 421, 422, and 423. A bank structure 430 is formed over the diode electrode. The bank defines pixel openings 441, 442 and 443, where active organic materials will be deposited to form the device. First photoactive layer 451 is shown in opening 441, a second photoactive layer 452 is shown in opening 442, a third photoactive layer 453 is shown in opening 443. Pixel opening 441 is over the first opening in the insulating layer 410. Pixel opening 442 is over the second opening in the insulating layer 410. Pixel opening 443 is over the third opening of the insulating layer 410. As can be seen in the drawing, the underlying structures for three pixel openings are quite different.

3. PROCESS FOR FORMING THE OPENINGS

When an organic planarization layer is used as the insulating layer, patterning of the layer can be accomplished using standard photolithographic techniques. In some embodiments, a photoresist layer is applied over the planarization layer, imaged, and developed to form a patterned mask. This is followed by treatment with a material which removes the planarization layer in the areas not covered with photoresist. The removal can be carried out by a dry etching step, in which the layer is subjected to treatment with an etching gas, such as a plasma. The removal can be carried out by a wet etching step, in which the layer is treated with a solvent. The removal can be carried out by a laser ablation step. In most cases, the organic material is removed by treatment with a solvent. In some embodiments, the photoresist is then stripped off. Techniques for imaging, developing, and stripping are well known in the photoresist art area.

In some embodiments, the organic planarization layer is made from a photosensitive photoresist. In this case, the layer can be imaged and developed to form the patterned planarization layer. The photoresist can be positive-working, which means that the photoresist layer becomes more removable in the areas exposed to activating radiation, or negative-working, which means this it is more easily removed in the non-exposed areas.

When the insulating layer is an inorganic passivation layer, the layer is generally formed by a vapor deposition process. The material can be deposited through a stencil mask to form the pattern. Alternatively, the material can be formed as a layer overall and patterned using a photoresist, as described above. Dry etching processes are generally used to remove the inorganic material to form the pattern.

The first openings, and other openings, when present, can be formed in separate steps, in any order. If all the openings that are formed have the same depth, then they can be formed at the same time, in the same processing step.

In some embodiments, openings having different depths can be formed at the same time, using the same process steps.

In one embodiment, this is achieved by using a photoresist to form an organic planarization layer as the insulating layer. After the photoresist is deposited and dried to form a layer, with optional baking, it is exposed to activating radiation through a gradient mask. The term "activating radiation" means energy in any form, including heat in any form, the entire electromagnetic spectrum, or subatomic particles, regardless of whether such radiation is in the form of rays, waves, or particles. In some embodiments, the activating radiation is selected from infrared radiation, visible radiation, ultraviolet radiation, and combinations thereof. In some embodiments, the activating radiation is UV radiation.

The gradient mask has a pattern in which there are areas that are opaque to the activating radiation and areas that are at least partially transparent to the activating radiation. In some embodiments, the partially transparent areas have 5-95% transmission; in some embodiments, 10-80% transmission; in some embodiments, 10-60% transmission; in some embodiments, 10-40% transmission; in some embodiments, 10-20% transmission.

In embodiments where a positive-working photoresist is used, the portions of the photoresist layer underneath the opaque areas of the mask will not be easily removed by development. If there are any fully transparent areas of the gradient mask, the underlying portions will become more easily and fully removed. If there are partially transparent areas of the mask, the underlying portions will be partially removable.

In embodiments where a negative-working photoresist is used, the portions of the photoresist layer underneath a transparent area of the gradient mask will become less removable while portions underneath an opaque areas of the mask will remain easily removed. Portions of the photoresist under a partially transparent areas of the mask will be partially removable.

Exposure times and doses will depend on the composition of the photoresist used, and on the radiation source. Exemplary times and doses are well known in the photoresist art.

After exposure to activating radiation, the photoresist is developed. The term "development" and all its various forms, is intended to mean physical differentiation between areas of the photoresist exposed to radiation and areas not exposed to radiation, hereinafter referred to as "development," can be accomplished by any known technique. Such techniques have been used extensively in the photoresist art. Examples of development techniques include, but are not limited to, evaporation, treatment with a liquid medium, treatment with an absorbant material, treatment with a tacky material, and the like. In some embodiments, the photoresist is treated with a liquid medium, referred to as a developer or developer solution.

The development step results in the formation of openings in the planarization layer. The openings will have different depths depending on the level of exposure through the mask: complete exposure through transparent sections of the mask, partial exposure through partially transparent sections of the mask, no exposure through the opaque sections of the mask. Thus, openings with different depths are formed and the planarization remains intact in the areas where no photoresist was removed by the development step.

The depth of the openings is controlled by the amount of transmission by the partially transparent areas of the gradient mask. When the planarization layer is to have second and third openings having depths that are different from the depth of the first opening, a gradient mask is used having a pattern of opaque areas, and two different semi-transmissive areas having different levels of transmission, or one semi-transmissive area and one transparent area.

Alternatively, two or more openings having different depths can be formed at the same time in an insulating layer that is not photosensitive, such an a non-photosensitive organic planarization layer or an inorganic passivation layer. In this case, a photoresist layer is formed on the non-photosensitive insulating layer, the photoresist is exposed through a gradient mask and developed, and the resulting partially-covered or uncovered insulating layer is treated with an etchant.

The photoresist materials and their deposition methods have been discussed above. In this embodiment, the photoresist layer must have a thickness that is sufficient to prevent etching of the underlying insulating layer in the areas where the photoresist remains after development. In general, a thickness in the range of approximately 2.0-5.5 microns is sufficient; in some embodiments, 2.5-5.0 microns.

The photoresist layer is then exposed to activating radiation and developed, as discussed above.

After development of the photoresist, there is an etching treatment. The etching material removes the insulating layer in the areas where the photoresist has been removed. In the areas where the photoresist has been partially removed, the insulating layer will be partially etched. In the areas where the photoresist remains intact, the insulating layer will not be etched at all. This method is particularly suited to inorganic insulating materials. The exact etchant to be used will depend upon the composition of the inorganic layer and such etching materials are well known. Examples of etchants include, but are not limited to, acidic materials such as HF, HF buffered with ammonium fluoride, and phosphoric acid. The etching step results in the formation of an inorganic bank structure. Dry etching with plasma may also be used. The resulting insulating layer has a pattern with openings resulting from complete etching in the first via areas. The insulating layer has partially removed inorganic layer in the second via areas, resulting from partial etching in the areas having partially removed photoresist. The insulating remains intact in the areas where no photoresist was removed and no etching took place.

Optionally, after the etching step, the remaining photoresist material can be stripped off. This step is also well known in the photoresist art. For positive-working photoresists, the remaining resist can be exposed to activating radiation and removed with the developer solution. Alternatively, the photoresist can be removed with solvent strippers. Negative-working photoresists can be removed by treatment with solvent strippers such as chlorinated hydrocarbons, phenols, cresols, aromatic aldehydes, and glycol ethers and esters. In some cases, the resists are removed by treatment with caustic strippers.

The via depth is controlled by the amount of etching that occurs, which, in turn, is controlled by the amount of light transmission in the different areas of the gradient mask. When the insulating layer is to have third openings having a depth that is different from the depths of the other two openings, a gradient mask is used having a pattern of opaque areas and three different levels of transmission.

3. ELECTRONIC DEVICE

The backplane described herein is particularly suited for organic electronic devices. In one embodiment, the organic electronic device comprises:
    a backplane comprising:
    a TFT substrate comprising a base substrate, a polysilicon layer, a gate dielectric layer, a gate electrode, an inter-layer dielectric, and a data electrode;
    an insulating layer over the TFT substrate;
    a multiplicity of first openings in the insulating layer having a depth $d1$;
    a multiplicity of pixelated diode electrode structures, wherein a first set of diode electrode structures are in the first openings;
    a bank structure defining pixel areas over the diode electrode structures;
    wherein the first openings and first set of diode electrode structures are in at least a first set of the pixel areas; and
    a first photoactive layer comprising a first photoactive material over the first set of diode electrode structures in the first openings in the first pixel areas.

In one embodiment, the organic electronic device further comprises:
    a multiplicity of second openings in the insulating layer having a depth $d2$, wherein a second set of diode electrode structures are in the second openings, and the second openings are in a second set of pixel areas; and
    a second photoactive layer comprising a second photoactive material over the second set of diode electrode structures in the second openings in the second pixel areas.

In one embodiment, the organic electronic device further comprises:
    a multiplicity of fourth openings in the insulating layer having a depth $d3$, wherein a third set of diode electrode structures are in the third openings, and the third openings are in a third set of the pixel areas; and
    a third photoactive layer comprising a third photoactive material on the third set of diode electrode structures in the third openings in the third pixel areas.

In some embodiments, $d1$, $d2$ and $d3$ are all the same. In some embodiments, $d1$, $d2$, and $d3$ are all different. In some embodiments, two of $d1$, $d2$, and $d3$ are the same, and one is different. In some embodiments the first, second, and third photoactive materials are all different. In some embodiments, the first, second, and third photoactive materials are light-emitting materials which have emission in the red, green, and blue regions of the visible spectrum, respectively.

An exemplary electronic device also includes in at least the pixel areas one or more organic buffer layers, charge transport layers, charge injection layers and a second electrode. Each of the charge transport layer(s) and the photoactive layer may include one or more layers. In another embodiment, a single layer having a graded or continuously changing composition may be used instead of separate charge transport and photoactive layers.

In an exemplary embodiment, the electrode in the backplane is an anode. In some embodiments, a first organic layer comprising organic buffer material is applied by liquid deposition. In some embodiments, a first organic layer comprising hole transport material is applied by liquid deposition. In some embodiments, first layer comprising organic buffer material and a second layer comprising hole transport material are formed sequentially. After the organic buffer layer and/or hole transport layer are formed, a photoactive layer is formed by liquid deposition. Different photoactive compositions comprising red, green, or blue emitting-materials may be applied to different pixel areas to form a full color display. After the formation of the photoactive layer, an electron transport layer is formed by vapor deposition. After formation of the electron transport layer, an optional electron injection layer and then the cathode are formed by vapor deposition.

The term "organic buffer layer" or "organic buffer material" is intended to mean electrically conductive or semiconductive organic materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Organic buffer materials may be polymers, oligomers, or small molecules, and may be in the form of solutions, dispersions, suspensions, emulsions, colloidal mixtures, or other compositions.

The organic buffer layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The organic buffer layer can comprise charge transfer compounds, and the like, such as copper phthalocyanine and the tetrathiafulvalene-tetracyanoquinodimethane system (TTF-TCNQ). In one embodiment, the organic buffer layer is made from a dispersion of a conducting polymer and a colloid-forming polymeric acid. Such materials have been described in, for example, published U.S. patent applications 2004-0102577, 2004-0127637, and 2005/205860. The organic buffer layer typically has a thickness in a range of approximately 20-200 nm.

The term "hole transport," when referring to a layer, material, member, or structure is intended to mean such layer, material, member, or structure facilitates migration of positive charge through the thickness of such layer, material, member, or structure with relative efficiency and small loss of charge. Although light-emitting materials may also have some charge transport properties, the term "charge transport layer, material, member, or structure" is not intended to include a layer, material, member, or structure whose primary function is light emission.

Examples of hole transport materials for layer 120 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4''-tris(N,N-diphenyl-amino)-triphenylamine (TDATA); 4,4',4''-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N, N'1-bis(4-ethylphenyl)-[1,1'-(3,3'-dimethyl)biphenyl]-4,4'-diamine (ETPD); tetrakis-(3-methylphenyl)-N,N,N',N'1-2,5-phenylenediamine (PDA); α-phenyl-4-N,N-diphenylaminostyrene (TPS); p-(diethylamino) benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino) styryl]-5-[p-(diethylamino)phenyl]pyrazoline (PPR or DEASP); 1,2-trans-bis(9H-carbazol-9-yl)cyclobutane (DCZB); N,N,N',N'1-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. The hole transport layer typically has a thickness in a range of approximately 40-100 nm.

"Photoactive" refers to a material that emits light when activated by an applied voltage (such as in a light emitting diode or chemical cell) or responds to radiant energy and generates a signal with or without an applied bias voltage (such as in a photodetector). Any organic electroluminescent ("EL") material can be used in the photoactive layer, and such materials are well known in the art. The materials include, but are not limited to, small molecule organic fluorescent compounds, fluorescent and phosphorescent metal complexes, conjugated polymers, and mixtures thereof. The photoactive material can be present alone, or in admixture with one or more host materials. Examples of fluorescent compounds include, but are not limited to, naphthalene, anthracene, chrysene, pyrene, tetracene, xanthene, perylene, coumarin, rhodamine, quinacridone, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Examples of conjugated polymers include, but are not limited to poly(phenylenevinylenes), polyfluorenes, poly(spirobifluorenes), polythiophenes, poly (p-phenylenes), copolymers thereof, and mixtures thereof. The photoactive layer 1912 typically has a thickness in a range of approximately 50-500 nm.

"Electron Transport" means when referring to a layer, material, member or structure, such a layer, material, member or structure that promotes or facilitates migration of negative charges through such a layer, material, member or structure into another layer, material, member or structure. Examples of electron transport materials which can be used in the optional electron transport layer 140, include metal chelated oxinoid compounds, such as tris(8-hydroxyquinolato)aluminum (AlQ), bis(2-methyl-8-quinolinolato)(p-phenylphenolato) aluminum (BAlq), tetrakis-(8-hydroxyquinolato) hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. The electron-transport layer typically has a thickness in a range of approximately 30-500 nm.

As used herein, the term "electron injection" when referring to a layer, material, member, or structure, is intended to mean such layer, material, member, or structure facilitates injection and migration of negative charges through the thickness of such layer, material, member, or structure with relative efficiency and small loss of charge. The optional electron-transport layer may be inorganic and comprise BaO, LiF, or Li$_2$O. The electron injection layer typically has a thickness in a range of approximately 20-100 Å.

The cathode can be selected from Group 1 metals (e.g., Li, Cs), the Group 2 (alkaline earth) metals, the rare earth metals including the lanthanides and the actinides. The cathode a thickness in a range of approximately 300-1000 nm.

An encapsulating layer can be formed over the array and the peripheral and remote circuitry to form a substantially complete electrical device.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A backplane for an organic electronic device comprising:
    a TFT substrate;
    an insulating layer over the TFT substrate;
    a multiplicity of first openings in the insulating layer having a depth d1;
    a multiplicity of pixelated diode electrode structures, wherein a first set of diode electrode structures are in the first openings, and the first set of diode electrode structures is less than the total number of diode electrode structures;
    a bank structure defining pixel areas over the diode electrode structures;
    wherein the first openings and first set of diode electrode structures are in at least a first set of the pixel areas, further comprising a multiplicity of second openings in the insulating layer having a depth d2, wherein a second set of diode electrode structures are in the second openings, and the second openings are in a second set of pixel areas, wherein d1 is different from d2.

2. The backplane of claim 1, wherein the first openings extend into the TFT substrate.

3. The backplane of claim 1, wherein the second openings extend into the TFT substrate.

4. The backplane of claim 1, further comprising a multiplicity of third openings in the insulating layer having a depth d3, wherein a third set of diode electrode structures are in the third openings, and the third openings are in a third set of pixel areas.

5. The backplane of claim 4, wherein the third openings extend into the TFT substrate.

6. The backplane of claim 4, wherein d1, d2, and d3 are all different.

7. The backplane of claim 1, wherein the insulating layer is organic.

8. The backplane of claim 1, wherein the insulating layer is inorganic.

9. An organic electronic device comprising:
    a backplane comprising:
        a TFT substrate;
        an insulating layer over the TFT substrate;
        a multiplicity of first openings in the insulating layer having a depth d1;
        a multiplicity of second openings in the insulating layer having a depth d2;
        a multiplicity of third openings in the insulating layer having a depth d3;
        a multiplicity of pixelated diode electrode structures, wherein a first set of diode electrode structures are in the first openings, wherein a second set of diode electrode structures are in the second openings, wherein a third set of diode electrode structures are in the third openings, and the first set of diode electrode structures is less than the total number of diode electrode structures;
        a bank structure defining pixel areas over the diode electrode structures;
        wherein the first openings and first set of diode electrode structures are in at least a first set of the pixel areas, and the second openings are in a second set of pixel areas and the third openings are in a third set of pixel areas; and a first photoactive layer comprising a first photoactive material over the first set of diode electrode structures in the first openings in the first pixel areas and a second photoactive layer comprising a second photoactive material in the second openings in the second pixel areas, and a third photoactive layer comprising a third photoactive material in the third openings in the third pixel areas, wherein d1, d2, and d3 are all different.

10. The device of claim 9, wherein the first, second, and third photoactive materials are light-emitting materials which have emission in the red, green, and blue regions of the visible spectrum, respectively.

* * * * *